United States Patent [19]

Wong

[11] 4,128,338

[45] Dec. 5, 1978

[54] MODIFIED OPTICAL TRANSMISSION TECHNIQUE FOR CHARACTERIZING EPITAXIAL LAYERS

[75] Inventor: Theodore T. S. Wong, Maynard, Mass.

[73] Assignee: Honeywell Inc., Minneapolis, Minn.

[21] Appl. No.: 807,608

[22] Filed: Jun. 17, 1977

[51] Int. Cl.² .................................... G01N 21/22
[52] U.S. Cl. .................................... 356/432
[58] Field of Search .................... 356/201, 202, 203

[56] References Cited

U.S. PATENT DOCUMENTS

| | | | |
|---|---|---|---|
| 3,496,024 | 2/1970 | Ruehrwein | 148/33.5 |
| 3,725,135 | 4/1973 | Hager et al. | 148/1.5 |
| 3,902,924 | 9/1975 | Maciolek et al. | 148/1.5 |

Primary Examiner—John K. Corbin
Assistant Examiner—R. A. Rosenberger
Attorney, Agent, or Firm—Theodore F. Neils; David R. Fairbairn

[57] ABSTRACT

An improved method of determining the energy bandgap of an epitaxial semiconductor layer on a substrate corrects for an overestimation of energy gap yielded by normal optical transmittance measurements. The overestimation of energy bandgap is caused by a graded bandgap region which exists between the epitaxial semiconductor layer and the substrate.

3 Claims, 10 Drawing Figures

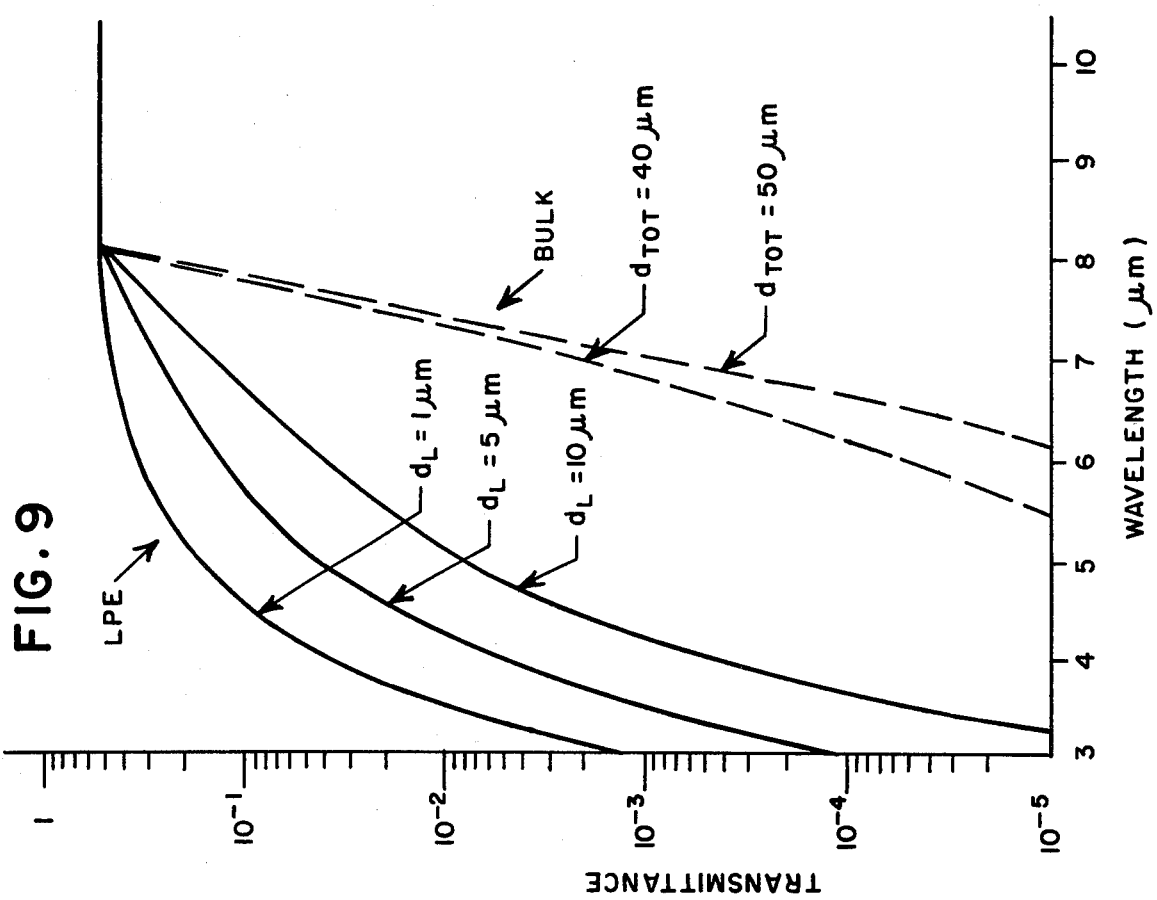
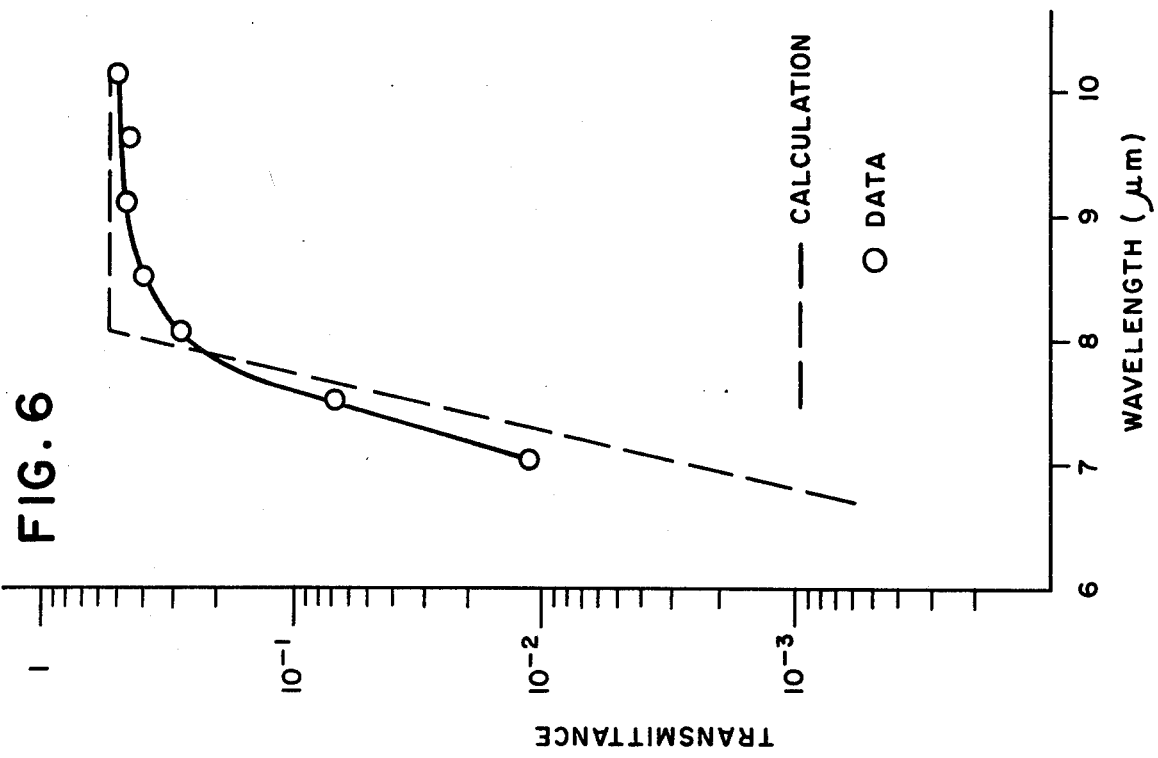

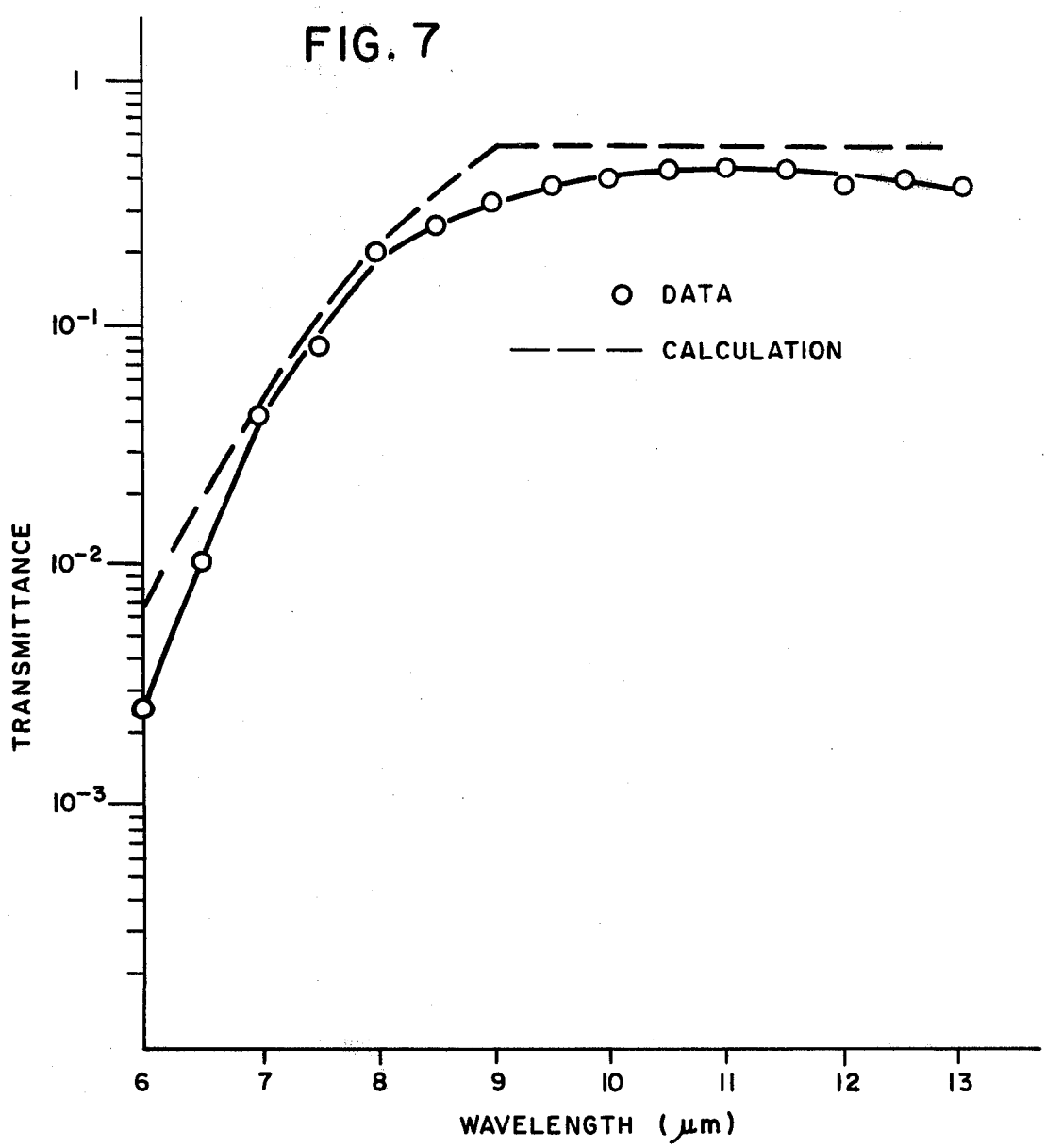

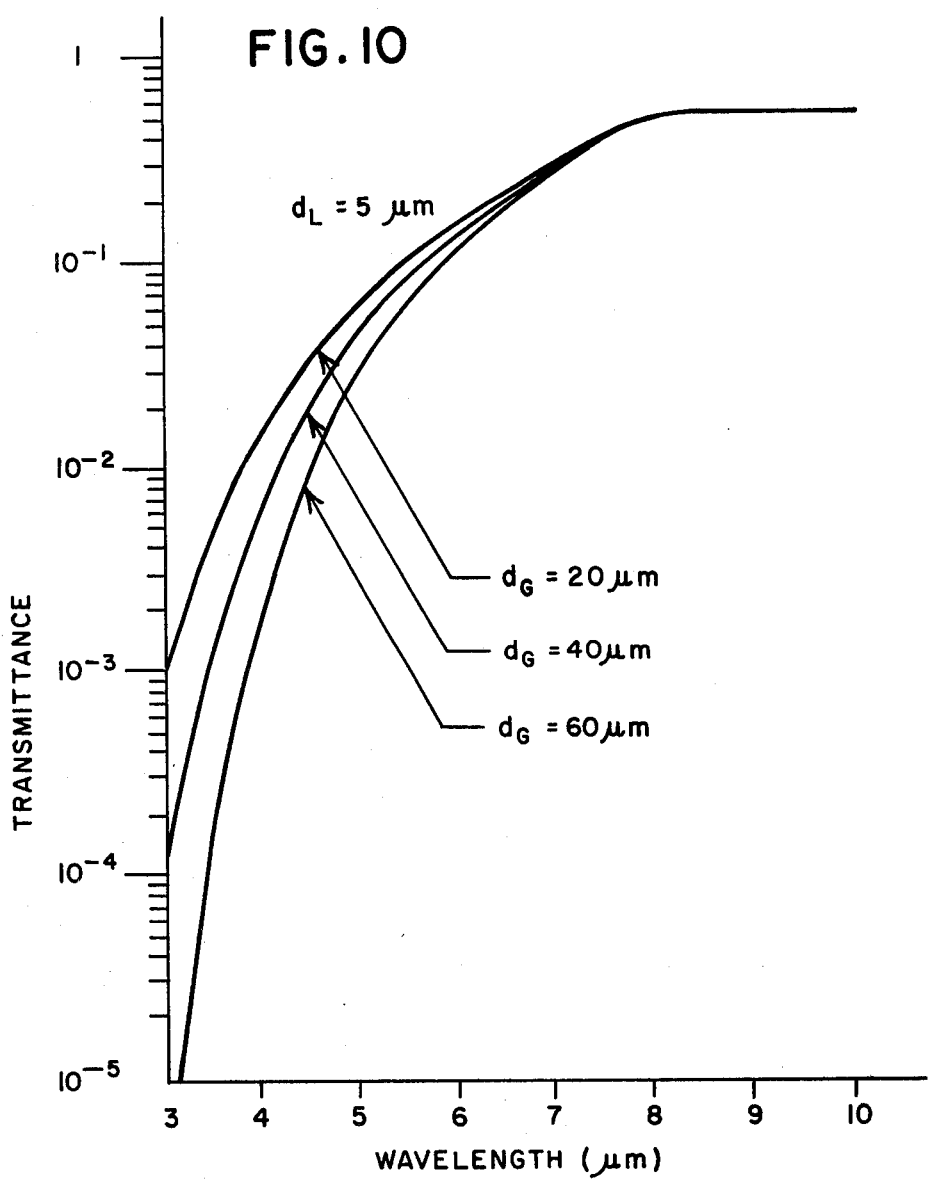

MODIFIED OPTICAL TRANSMISSION TECHNIQUE FOR CHARACTERIZING EPITAXIAL LAYERS

ORIGIN OF THE INVENTION

The present invention was made in the course of a contract with the Department of Army.

BACKGROUND OF THE INVENTION

The present invention is concerned with the characterization of epitaxial layers. The present invention is particularly useful in characterizing epitaxial layers of semiconductor alloys such as mercury cadmium telluride, lead tin telluride, indium arsenide antimonide, gallium arsenide phosphide, and others.

For the purposes of simplicity, the present invention will be described with reference to a particular semiconductor alloy: mercury cadmium telluride. The common chemical notation for mercury cadmium telluride, (Hg,Cd)Te, or $Hg_{1-x}Cd_xTe$, will be used.

Mercury cadmium telluride is an intrinsic photodetector material which consists of a mixture of cadmium telluride, a widegap semiconductor ($E_g = 1.6ev$), with mercury telluride, which is a semimetal having a "negative energy gap" of about 0.3ev. The energy gap of the alloy varies linearly with x, the mole fraction of cadmium telluride in the alloy. By properly selecting "x", it is possible to obtain mercury cadmium telluride detector material having a peak response over a wide range of infrared wavelengths.

(Hg,Cd)Te is of particular importance as a detector material for the important 8 to 14 micron atmospheric transmission "window". Extrinsic photoconductor detectors, notably mercury doped germanium, have been available with high performance in the 8 to 14 micron wavelength interval. These extrinsic photoconductors, however, require very low operating temperatures (below 30° K). (Hg,Cd)Te intrinsic photodetectors having a spectral cutoff of 14 microns, on the other hand, are capable of high performance at 77° K.

At the present time, most (Hg,Cd)Te is produced by bulk growth techniques such as the technique described by P. W. Kruse et al. in U.S. Pat. No. 3,723,190. High quality (Hg,Cd)Te crystals are produced by this bulk growth technique.

Epitaxial growth techniques offer a number of potential advantages over bulk growth techniques. An epitaxial layer is a smooth continuous film grown on a substrate, such that the film crystal structure corresponds to and is determined by that of the substrate. The desired epitaxial layer is single crystal with uniform thickness and electrical property. The substrate has a different composition or electrical properties from that of the epitaxial layer.

A number of epitaxial growth techniques have been investigated in an attempt to grow (Hg,Cd)Te layers. Vapor phase epitaxial growth processes which have been studied are described in a number of patents including R. Ruehrwein (U.S. Pat. No. 3,496,024), G. Manley et al. (U.S. Pat. No. 3,619,282), D. Carpenter et al. (U.S. Pat. No. 3,619,283), R. Lee et al. (U.S. Pat. No. 3,642,529), and R. Hager et al. (U.S. Pat. No. 3,725,135).

Another epitaxial growth technique which has been investigated is liquid phase epitaxy ("LPE"). This technique is described in R. Maciolek et al. (U.S. Pat. No. 3,902,924). Liquid phase epitaxial growth offers a number of advantages over both vapor phase epitaxial growth and bulk growth of (Hg,Cd)Te.

One characteristic of epitaxial film grown by both vapor phase epitaxy and liquid phase epitaxy is a tendency to exhibit a compositional gradient along the crystal growth direction. This is particularly true when CdTe is used as the substrate material. Examples of compositional profiles through the thickness of epitaxially grown films are shown in FIGS. 3, 5, 6 and 9 of the previously mentioned Hager et al. patent (U.S. Pat. No. 3,725,135) and in FIGS. 4a–4e of the previously mentioned Maciolek et al. patent (U.S. Pat. No. 3,902,924). The device formed by epitaxial growth may be considered, therefore, to have three regions: the substrate, a graded composition or graded bandgap region, and the epitaxial layer of desired composition.

SUMMARY OF THE INVENTION

The present invention is directed to an improved method of characterizing an epitaxial layer on a substrate, wherein a graded bandgap region exists between the epitaxial layer and a substrate. It is based upon the discovery that conventional optical transmission techniques are inaccurate because the existence of a graded bandgap region causes the transmittance curves to deviate from those expected for homogenous material. The deviation, if uncorrected, leads to an underestimation of the cutoff wavelength, and thus an overestimation of the bandgap of the epitaxial layer.

The method of the present invention overcomes this problem by determining the thickness $d_S$ of the substrate, the thickness $d_G$ of the graded bandgap region, and the thickness $d_L$ of the semiconductor layer. The energy gap of the epitaxial layer is determined based upon the values of $d_S$, $d_G$, and $d_L$ and the results of measurements of the total optical transmittance of the layer, graded bandgap region, and substrate as a function of wavelength.

BRIEF DESCRIPTION OF THE DRAWINGS

FIG. 6 shows calculated and measured transmittance as a function of wavelength for bulk (Hg,Cd)Te.

FIG. 7 shows calculated and measured transmittance of a liquid phase epitaxial layer of (Hg,Cd)Te on a cadmium telluride substrated.

FIG. 9 shows the effects of epitaxial layer thickness $d_L$ on transmittance.

FIG. 10 shows the effect of graded bandgap region thickness $d_G$ on transmittance.

DETAILED DESCRIPTION OF THE PREFERRED EMBODIMENT

The present invention is an improved method of characterizing epitaxial semiconductor layers by a modified optical transmission technique. Optical transmission measurements are commonly used to determine the energy gap $E_g$ of semiconductor materials. This is of particular importance in alloy semiconductors such as (Hg,Cd)Te and lead tin telluride since the energy gap varies with composition of the alloy. The value of the energy gap is particularly important information when the semiconductor material is to be used as a photodetector, since the energy gap determines the wavelengths to which the material will be sensitive.

The present invention is based upon the discovery that conventional transmission measurement techniques yield inaccurate values of energy gap in those epitaxial structures which have a graded bandgap region between the epitaxial layer and the substrate. For most device applications, it is the energy gap of the material at or very close to the surface of the epitaxial layer which is of interest. The existence of a graded bandgap region, however, causes the transmittance curves to deviate from those expected for homogenous materials. This deviation or perturbation, if uncorrected, leads to an underestimation of the cutoff wavelength $\lambda_{co}$, and thus an overestimation of the energy gap of the epitaxial layer.

Figure 1:
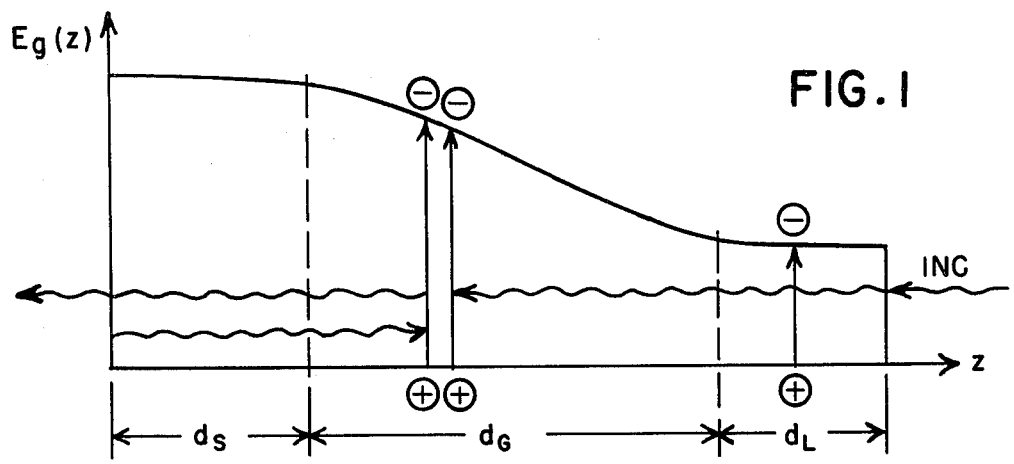
FIG. 1 illustrates schematically how light transmits through a cadmium telluride-mercury cadmium telluride epitaxial structure.
Figure 2:
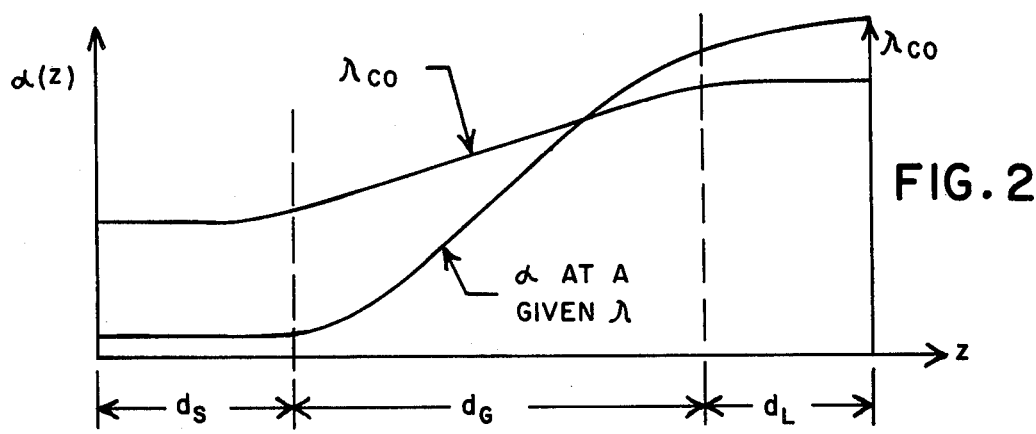
FIG. 2 shows absorption, $\alpha$ and cutoff wavelength $\lambda_{co}$ as a function of thickness z for a CdTe-(Hg,Cd)Te epitaxial structure.

FIGS. 1 and 2 show the effect of the graded bandgap region on optical transmission measurements. In FIG. 1, the bandgap $E_g$ (Z) is shown as a function of thickness Z. In FIG. 2, the absorption coefficient $\alpha(Z)$ and cutoff wavelength $\lambda_{co}$ are shown as a function of thickness Z. In FIGS. 1 and 2, $d_S$ and $d_L$ are the thicknesses of the substrate (for example, cadmium telluride) and the epitaxial layer (for example, mercury cadmium telluride), respectively. The thickness of the graded bandgap region is $d_G$.

As shown in FIGS. 1 and 2, the energy gap within the graded bandgap region is continuously changing from that of the substrate to that of the epitaxial layer with the desirable composition. When photons are incident on the layer surface, they are absorbed in the layer as well as in the graded bandgap region, if the layer is thin. The effects of the graded bandgap on the overall transmittance curve must be determined in order to modify the conventional transmittance technique to compensate for errors caused by the graded bandgap region.

Consider a homogenous material having a constant absorption coefficient $\alpha$ between two optically flat surfaces. Let $P_i$ be the radiation power incident on the material, and $P_t$ be the power transmitted. The transmittance T is (including multiple internal reflection)

$$T = \frac{P_t}{P_i} = \frac{(I-R)^2 \exp(-\alpha d)}{1 - R^2 \exp(-2\alpha d)} \quad \text{Eq. 1}$$

where R is the reflectivity and d is the thickness of the slab. For a CdTe—(Hg,Cd)Te structure, the absorption coefficient $\alpha$ (z) is a function of thickness Z, Eq. 1 can be written as $$T = \frac{(I-R_L)(I-R_S) \exp \int_o^d \alpha(Z) dZ}{1 - R_L R_S \exp[-2 \int_o^d \alpha(Z) dZ]} \quad \text{Eq. 2}$$

where the subscripts L and S stand for layer and substrate, respectively, and $d = d_L + d_G + d_S$.

Figure 3:
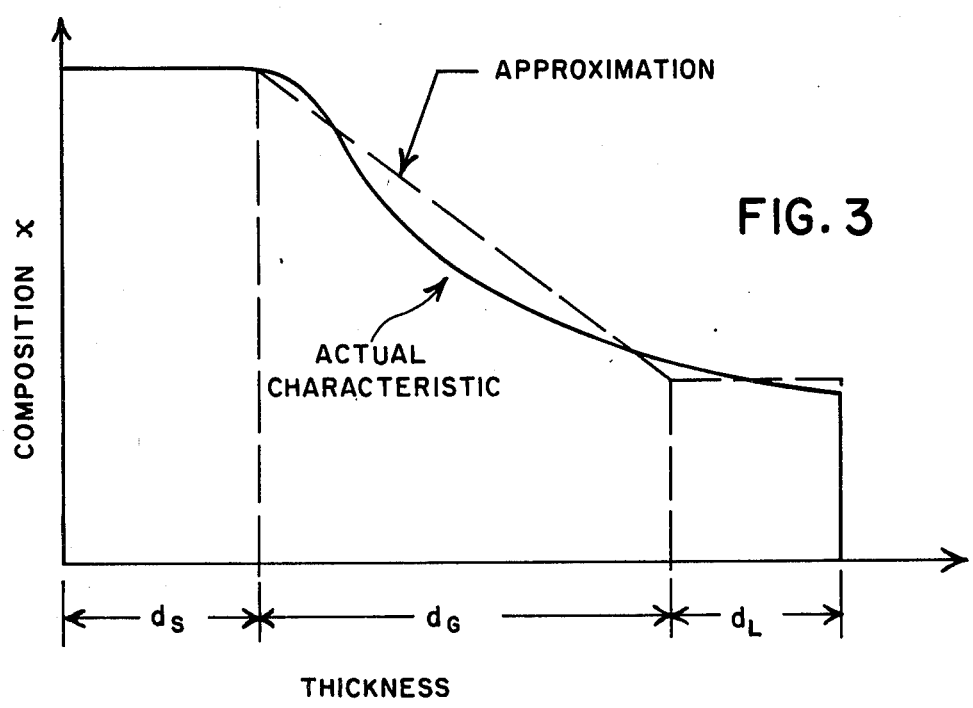
FIG. 3 shows the linear graded-gap approximation used in the calculations.

In order to illustrate the effects of the graded-gap on the overall transmittance curve, a linear graded-gap approximation is made (see FIG. 3). This approximation allows Eq. 2 to be quantified, since it relates the composition x (and therefore $E_g$) directly to the thickness Z. As a result, the function $\alpha(Z)$ can be explicitly determined if $\alpha(x)$ is known. The function $\alpha(x)$ has been derived and satisfactory agreement with data was obtained (M.D. Blue, Phys. Rev. 134, A226 (1964)). The reflectivity R of CdTe and (Hg,Cd)Te have also been measured and are known.

Figure 4:
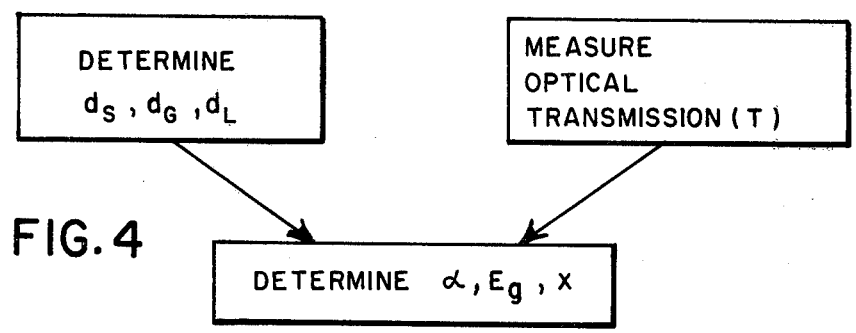
FIG. 4 illustrates the modified optical transmission technique of the present invention.

FIG. 4 illustrates the modified optical transmission characterization technique of the present invention. In this method, the thicknesses $d_S$, $d_G$, and $d_L$ are determined and the optical transmission T is measured. Based upon the values of T, $d_S$, $d_G$ and $d_L$, it is possible to solve equation 2 for the absorption coefficient $\alpha$ in the layer numerically. Once $\alpha$ is known, the values of enery gap $E_g$ and composition x for the layer can be readily determined.

Figure 5:
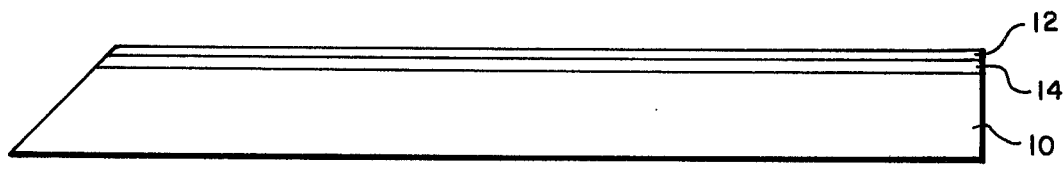
FIG. 5 shows a CdTe-(Hg,Cd)Te epitaxial structure which has been angle-lapped at one edge to allow measurement of thicknesses $d_S$, $d_G$, and $d_L$l.

FIG. 5 shows a (Hg,Cd)Te-CdTe structure on which the modified optical transmission of the present invention is used. The structure includes the CdTe substrate 10, (Hg,Cd)Te epitaxial layer 12 of a desired composition, and a graded bandgap and composition region 14 interposed between substrate 10 and epitaxial layer 12. In FIG. 5, one edge of the structure has been anglelapped. This allows electron beam microprobe measurements to be made from which thicknesses $d_S$, $d_G$, and $d_L$ can be determined. The angle-lapping and electron beam microprobe measurements are a destructive testing technique and cannot, therefore, be used on the entire sample to determine composition. The primary advantage of optical transmission measurements are that they are non-destructive, so that detectors can be formed from the material tested.

In the present invention, angle-lapping only an edge of the structure leaves the remainder of the structure available for fabricating detectors. Assuming that the thicknesses $d_S$, $d_G$ and $d_L$ are relatively constant over the area of the structure, the data obtained from the angle-lapping and electron beam microprobe measurements at the edge of the structure provides the necessary information to correct the optical transmission measurements made on other areas of the structure. From these nondestructive optical transmission tests, it is possible to determine $\alpha$, $E_g$ and x of layer 12 at any point on layer 12.

In order to demonstrate the applicability of the method of the present invention and check the suitability of the values of $\alpha$ and R, calculations were performed using equation 1 for a x = 0.2 bulk (Hg,Cd)Te slab having a thickness of 0.500 millimeter. The transmittance as a function of wavelength in these calculations is shown in FIG. 6. In addition, transmittance measurements from the slab are also shown in FIG. 6. Agreement between the calculated values and the measured values can be seen to be satisfactory.

Figure 8:
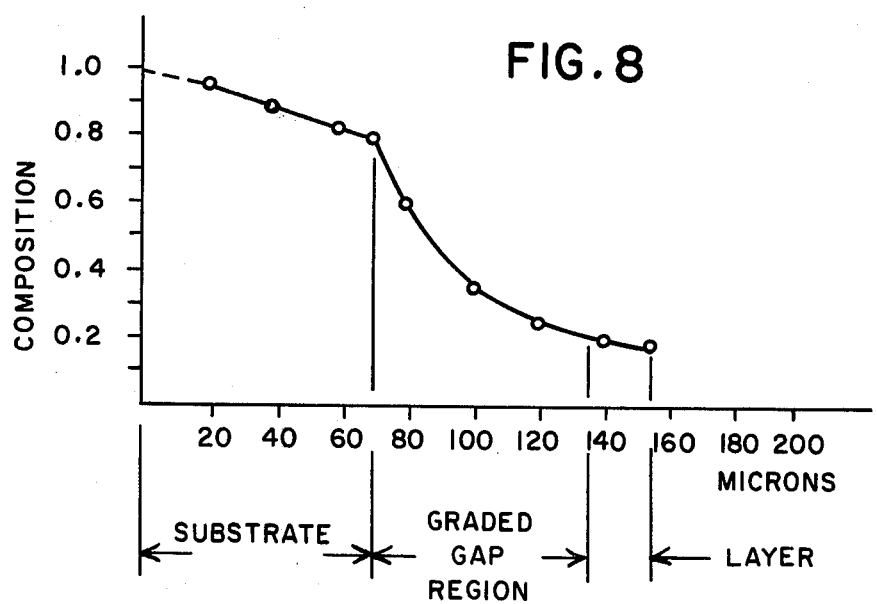
FIG. 8 shows composition as a function of thickness as measured by electron beam microprobe for the same sample used for measurements in FIG. 7.

FIG. 7 shows the comparison between calculated transmittance based upon equation 2 and measured transmittance for a liquid phase epitaxial (LPE) grown (Hg,Cd)Te layer on a CdTe substrate. The value of $d_L$ was 20 microns, the value of $d_G$ was 65 microns, and the x value of the layer was 0.19. The integrations required in equation 2 were performed by numerical methods. The thickness dependent absorption coefficient $\alpha(Z)$ was determined by the thickness dependent x value obtained by electron beam microprobe analysis as shown in FIG. 8. It can be seen that the agreement between the calculated and measured values of transmittance as shown in FIG. 7 are excellent. This demonstrates that equation 2 is accurate and can be used to determine $\alpha$, $E_g$, and x of the layer when $d_S$, $d_G$, $d_L$, and T are known.

FIG. 9 shows the effect of layer thickness $d_L$ on T as calculated using equation 2. In FIG. 9, curves are plotted in which the thickness of the layer is 1 micron, 5 microns, and 10 microns. In addition, two calculated curves for bulk material having a total thickness of 40 microns and 50 microns respectively are shown. In the three LPE curves, the x value of the layer is 0.2, which is the same x value assumed in the bulk calculation. It can be seen that the larger $d_L$ becomes, the more bulk-like the transmittance curve becomes.

FIG. 10 illustrates the effects of the thickness $d_G$ of the graded gap region on the transmittance calculated with equation 2. For all three curves, the thickness of the layer $d_L$ was 5 microns and the x value was 0.2. The thicknesses of $d_G$ of 20, 40, and 60 microns were used. It can be seen from FIG. 10 that as $d_G$ increases, the curves once again become more bulk-like.

In conclusion, the existence of a graded bandgap region in an epitaxial semiconductor structure, causes transmittance curves to deviate from those expected for homogenous materials. This deviation can lead to an underestimation of cutoff wavelength and thus an overestimation of x value and energy gap of the epitaxial layer. The method of the present invention overcomes this shortcoming of prior art optical transmission measurement technique and provides accurate composition and energy gap data on epitaxial films by a non-destructive technique.

Although the present invention has been described with reference to the preferred embodiments, workers skilled in the art will recognize that changes may be made in form and detail without departing from the spirit and scope of the invention. For example, the present invention has been described with specific reference to (Hg,Cd)Te-CdTe epitaxial structures. The present invention is equally applicable to other epitaxial structures such as lead tin telluride on lead telluride substrates, gallium arsenide or gallium arsenide phosphide on gallium phosphide substrates and a wide variety of other epitaxial structures in which a graded bandgap region exists between the epitaxial semiconductor layer and the substrate.

The embodiments of the invention in which an exclusive property or right is claimed are defined as follows:

1. A method of determining the energy bandgap of an epitaxial semiconductor layer on a substrate, wherein a graded bandgap region exists between the epitaxial semiconductor layer and the substrate, the method comprising:

determining the thickness $d_S$ of the substrate, the thickness $d_G$ of the graded bandgap region, and the thickness $d_L$ of the epitaxial semiconductor layer;

measuring optical transmittance of the layer, graded bandgap region and substrate as a function of wavelength; and determining the energy gap of the layer from the values of $d_S$, $d_G$, and $d_L$ and the results of the measuring of optical transmittance.

2. The method of claim 1 wherein determining thicknesses $d_S$, $d_G$, and $d_L$ is by a destructive testing technique on a portion of the layer, graded bandgap region, and substrate.

3. The method of claim 2 wherein the destructive testing technique comprises:

angle-lapping an edge of the layer to expose a portion the layer, the graded bandgap region, and substrate; and performing electron beam microprobe measurements on the exposed portion.

* * * * *